US 6,559,689 B1

(12) United States Patent
Clark

(10) Patent No.: US 6,559,689 B1
(45) Date of Patent: May 6, 2003

(54) CIRCUIT PROVIDING A CONTROL VOLTAGE TO A SWITCH AND INCLUDING A CAPACITOR

(75) Inventor: Timothy A. Clark, Noblesville, IN (US)

(73) Assignee: Allegro Microsystems, Inc., Worcester, MA (US)

( * ) Notice: Subject to any disclaimer, the term of this patent is extended or adjusted under 35 U.S.C. 154(b) by 0 days.

(21) Appl. No.: 09/677,286

(22) Filed: Oct. 2, 2000

(51) Int. Cl.[7] .............................................. H03K 17/00
(52) U.S. Cl. ........................... 327/97; 327/91; 327/390; 327/337
(58) Field of Search .............................. 327/91, 97, 94, 327/390, 589, 337

(56) References Cited

U.S. PATENT DOCUMENTS

| | | |
|---|---|---|
| 4,065,766 A | 12/1977 | Butler et al. |
| 4,383,246 A | 5/1983 | Munt |
| 4,703,407 A | 10/1987 | Fry et al. |
| 4,853,563 A | 8/1989 | Hill et al. |
| 4,873,408 A | 10/1989 | Smith et al. |
| 4,940,906 A | 7/1990 | Gulczynski |
| 4,965,578 A | 10/1990 | Poujois |
| 5,172,019 A | 12/1992 | Naylor et al. |
| 5,262,779 A | 11/1993 | Sauer |
| 5,331,323 A | 7/1994 | Yamamoto |
| 5,408,150 A | 4/1995 | Wilcox |
| 5,442,218 A | 8/1995 | Seidel et al. |
| 5,517,379 A | 5/1996 | Williams et al. |
| 5,539,610 A | 7/1996 | Williams et al. |
| 5,550,412 A | 8/1996 | Anneser |
| 5,581,454 A | 12/1996 | Collins |
| 5,598,118 A | 1/1997 | Koifman et al. |
| 5,635,867 A | 6/1997 | Timm |
| 5,666,035 A | 9/1997 | Basire et al. |
| 5,691,870 A | 11/1997 | Gebara |
| 5,726,594 A | 3/1998 | Williams |
| 5,748,016 A | 5/1998 | Kurosawa |
| 5,748,134 A | 5/1998 | Dent |
| 5,790,063 A | 8/1998 | Koifman et al. |
| 5,804,943 A | 9/1998 | Kollman et al. |
| 5,905,404 A | * 5/1999 | Nagaraj ...................... 327/390 |
| 5,933,034 A | 8/1999 | Hastings et al. |
| 5,936,833 A | 8/1999 | Grossman et al. |
| 5,943,227 A | 8/1999 | Bryson et al. |
| 5,945,845 A | 8/1999 | Thomann et al. |
| 5,945,872 A | * 8/1999 | Robertson et al. .......... 327/390 |
| 5,949,271 A | * 9/1999 | Fujikura ..................... 327/390 |
| 5,962,985 A | 10/1999 | Buij et al. |
| 6,005,439 A | * 12/1999 | Fong .......................... 330/253 |
| 6,052,000 A | * 4/2000 | Nagaraj ...................... 327/91 |
| 6,072,355 A | * 6/2000 | Bledsoe ...................... 327/390 |
| 6,118,326 A | * 9/2000 | Singer et al. ............... 327/390 |
| 6,215,329 B1 | * 4/2001 | Campardo et al. .......... 327/390 |

\* cited by examiner

Primary Examiner—Terry D. Cunningham
(74) Attorney, Agent, or Firm—Daly, Crowley & Mofford, LLP

(57) ABSTRACT

A circuit for providing a control voltage to a switch includes a capacitor, a first pair of switches for coupling the capacitor to an input voltage source and a second pair of switches for coupling the capacitor to the switch. The first pair of switches is controlled by a control signal in response to the voltage across the capacitor in order to prevent overcharging the capacitor beyond a first predetermined level. The second pair of switches is controlled by a second control signal in response to the voltage across the switch in order to replenish the capacitor voltage when the capacitor voltage falls to a second predetermined level. The first and second pairs of switches are closed during non-overlapping time intervals in order to isolate the switch from the input voltage source, thereby preventing switching transients from affecting the input voltage source and permitting the circuit to be used to drive a variety of switch types arranged in a variety of configurations.

14 Claims, 9 Drawing Sheets

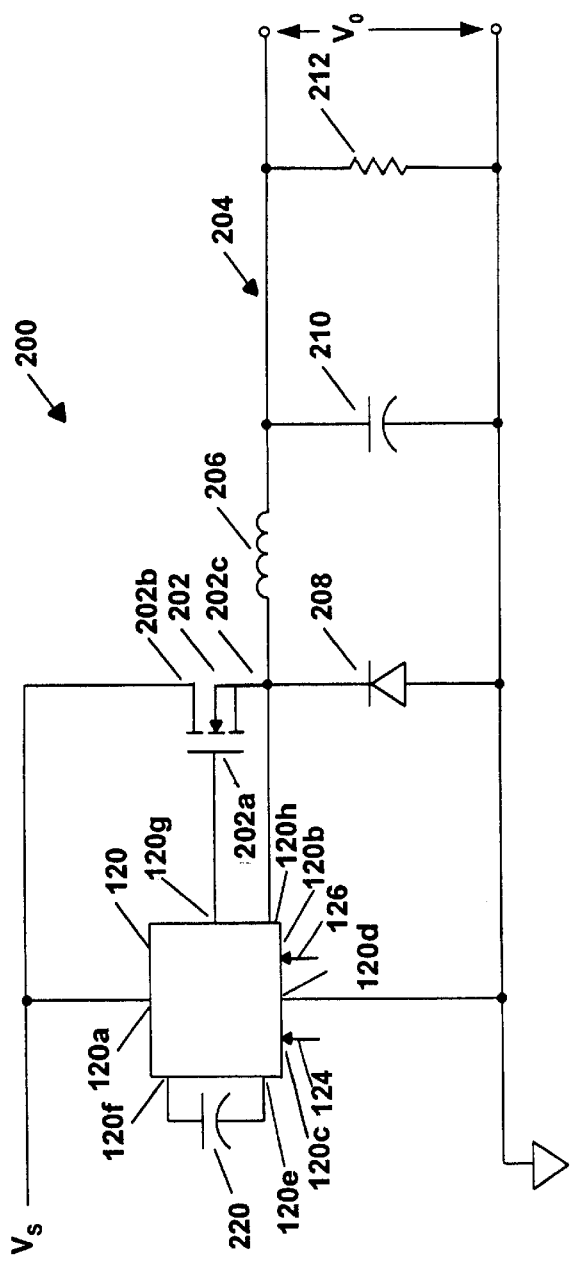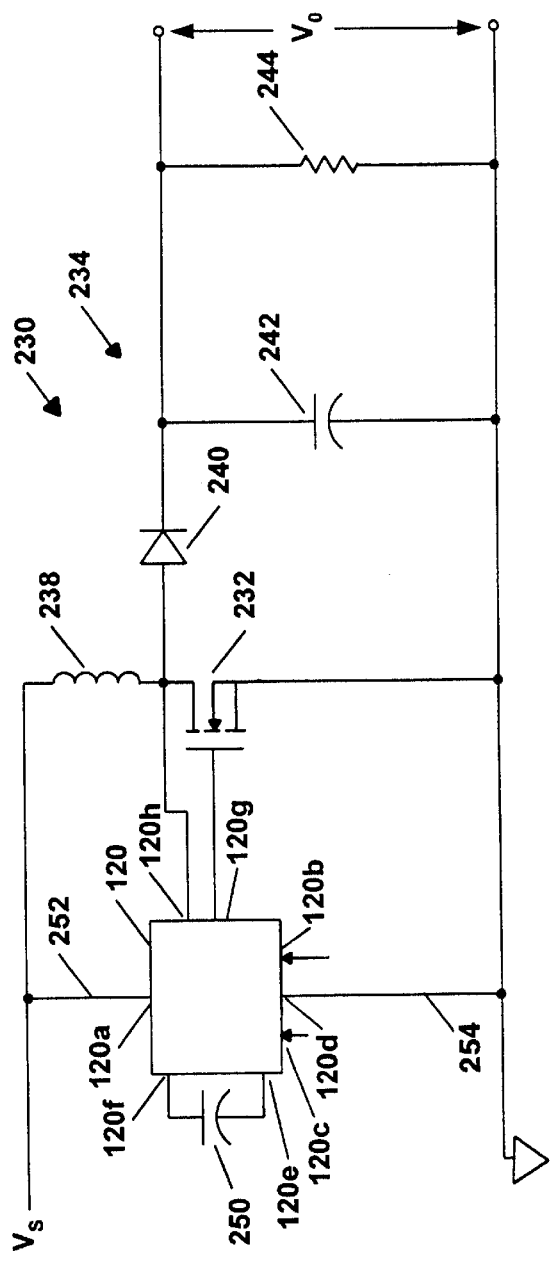

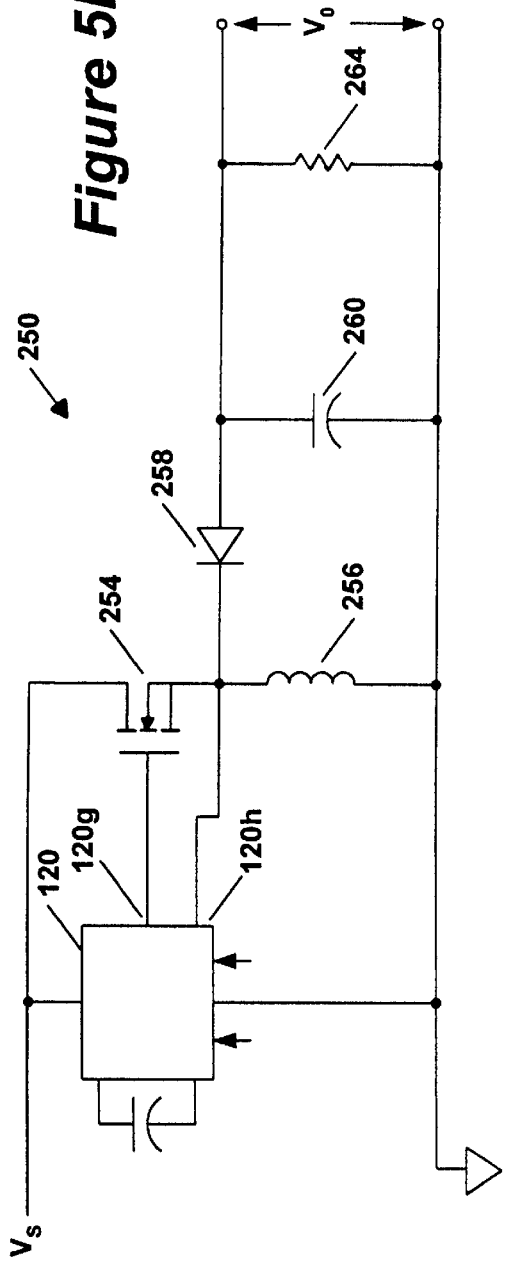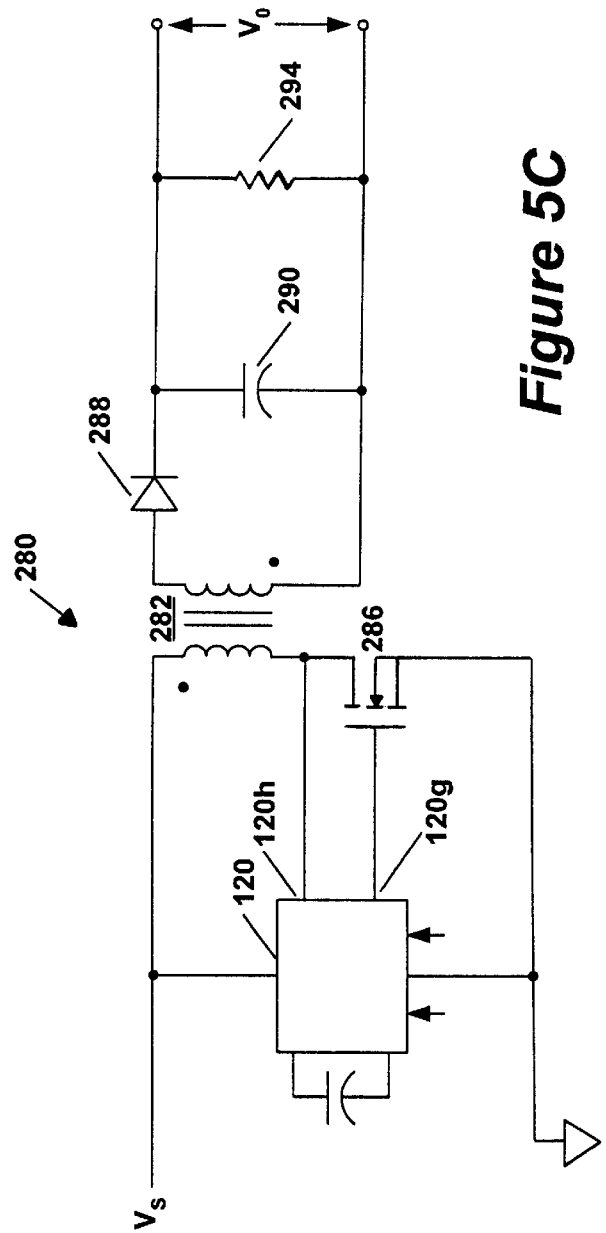

ated circuit incorporating the control voltage circuit of FIG. 2;

CIRCUIT PROVIDING A CONTROL VOLTAGE TO A SWITCH AND INCLUDING A CAPACITOR

CROSS-REFERENCE TO RELATED APPLICATIONS

Not applicable.

STATEMENT REGARDING FEDERALLY FUNDED RESEARCH

Not applicable.

BACKGROUND OF THE INVENTION

Transistors are commonly used as the switching device in circuits supplying a load which requires a switching source, such as power supplies, motor drivers, amplifiers, etc. Such circuits may utilize one or more transistors of various types, such as Metal Oxide Field Effect Transistors (MOSFETs, or simply FETs) or Insulated Gate Bipolar Transistors (IGBTs), arranged in various topologies. The voltage across the transistor may be fixed or unknown, depending on the particular topology.

The control voltage necessary to drive a particular switch is a function of the switch type and topology. For example, the control, or gate voltage necessary to drive a high current, power FET must present a predetermined differential voltage across the gate and source terminals of the FET, such as on the order of 10 volts. More particularly, in an N-channel FET, the gate voltage must be brought to approximately 10 volts higher than the source voltage and in a P-channel FET, the gate voltage must be brought to approximately 10 volts lower than the source voltage. The absolute value of the control voltage may be as low as 10 volts in the case of driving a "low side" FET in which the source terminal is coupled to ground or may be an unknown voltage in the case of driving a "high side" FET or floating low side FET in which the source terminal is at an unknown voltage.

Various circuits are used to provide switch control voltage. One such circuit is referred to as a "bootstrap" circuit and is most commonly used to drive FETs in applications in which the source voltage is unknown. The voltage across a bootstrap capacitor coupled between an input voltage source and the source terminal of the FET rises as the source voltage rises and thus, provides a voltage which is at a predetermined level higher than the source voltage. However, since the bootstrap circuit does not provide any isolation between the bootstrap voltage and the input voltage source, current and voltage transients caused by the switching FET can affect the input voltage source.

A charge pump, which generates an output voltage in response to a lower input voltage, is sometimes used to provide the necessary FET gate drive voltage. However, like the bootstrap circuit, the charge pump does not provide any isolation between the input voltage source and the power switch.

Pulse transformers can be used to provide isolation between the input voltage source and the power switch, in order to prevent transients from affecting the input voltage source. However, pulse transformers can be expensive and bulky.

SUMMARY OF THE INVENTION

It is an object of the present invention to provide a circuit for generating a control voltage for switches arranged in various configurations.

It is a further object to provide a circuit for generating a switch control voltage which provides isolation between an input voltage source and the switch without the use of a transformer.

These and other objects of the invention are achieved with a circuit including a capacitor, a first pair of switches adapted to coupled the capacitor to an input voltage source during a first time interval, and a second pair of switches adapted to couple the capacitor to a control terminal of a switch during a second time interval which is nonoverlapping with respect to the first time interval. The voltage across the capacitor provides a predetermined differential voltage which is independent of the input voltage or any other fixed voltage.

With this arrangement, the circuit can be used to provide drive switches arranged in various configurations, including high side switches and floating low side switches, in which cases a terminal of the switch is at an unknown, or floating voltage. Also, the above-described circuit provides isolation between the input voltage source and the switch, thereby advantageously preventing current and voltage transients from affecting the input voltage source.

A control circuit provides a first control signal to each of the first pair of switches in response to the voltage across the capacitor and a second control signal to each of the second pair of switches in response to the voltage across the switch. In one embodiment, a first comparator has a first input terminal coupled to the capacitor, a second input terminal coupled to a threshold voltage, and an output terminal at which an output signal is provided to the control circuit. The output signal is indicative of whether or not the voltage across the capacitor is greater than a predetermined level and the first control signal causes the first pair of switches to open when the voltage across the capacitor is greater than the predetermined level. In this way, the first pair of switches is opened to prevent the capacitor from charging to a voltage that is too high to safely drive the switch.

A second comparator has a first input terminal coupled to the control terminal of the switch, a second input terminal coupled to the reference terminal of the switch, and an output terminal coupled to the control circuit at which an output signal is provided. The output signal of the second comparator is indicative of whether or not the voltage across the switch is less than a predetermined level and the second control signal provided by the control circuit causes the second pair of switches to open when the voltage across the control and reference terminals of the switch is less than the predetermined level. In this way, charge on the capacitor is replenished to keep the capacitor voltage above a minimum level necessary to fully enhance the switch.

BRIEF DESCRIPTION OF THE DRAWINGS

The foregoing features of this invention, as well as the invention itself, may be more fully understood from the following description of the drawings in which:

FIG. 5 is a schematic of a Buck converter utilizing the circuit of FIG. 3;

FIG. 5A is a schematic of a boost converter utilizing the circuit of FIG. 3;

FIG. 5B is a schematic of a Buck-boost converter utilizing the circuit of FIG. 3;

FIG. 5C is a schematic of a flyback converter utilizing the circuit of FIG. 3;

DETAILED DESCRIPTION OF THE INVENTION

Figure 1:
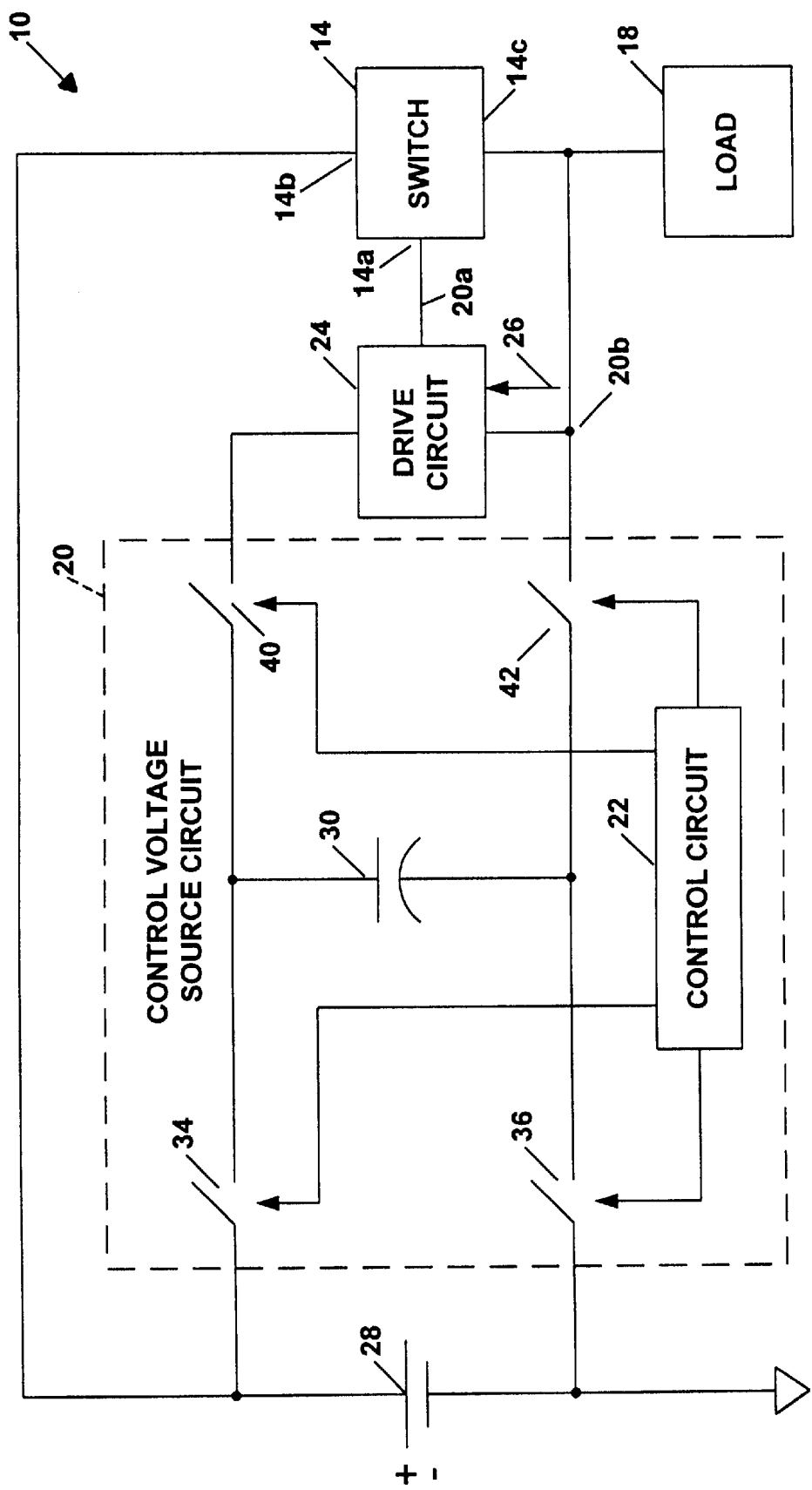
FIG. 1 is a block diagram of a circuit including a control voltage circuit for generating a control voltage for a switch according to the invention.

Referring to FIG. 1, a circuit 10 includes a switch 14 having a control terminal 14a, an input terminal 14b, and a reference terminal 14c, a load 18 coupled to the switch, an input voltage source 28, and a control voltage circuit 20 for generating a control voltage for the switch. The control voltage generated by the circuit 20 is coupled to a drive circuit 24 which provides the necessary current to turn the switch 14 on and off The switch 14 and load 18 may take various forms for various applications. As examples, the switch 14 may be a power transistor, such as a FET or IGBT, and the load 18 may be the output section of a power supply or a motor. In the illustrative embodiment, the circuit 10 is a switch-mode power supply used in automotive applications and the input voltage source 28 is provided by a battery providing a voltage between 14 and 42 volts DC.

Figure 4:
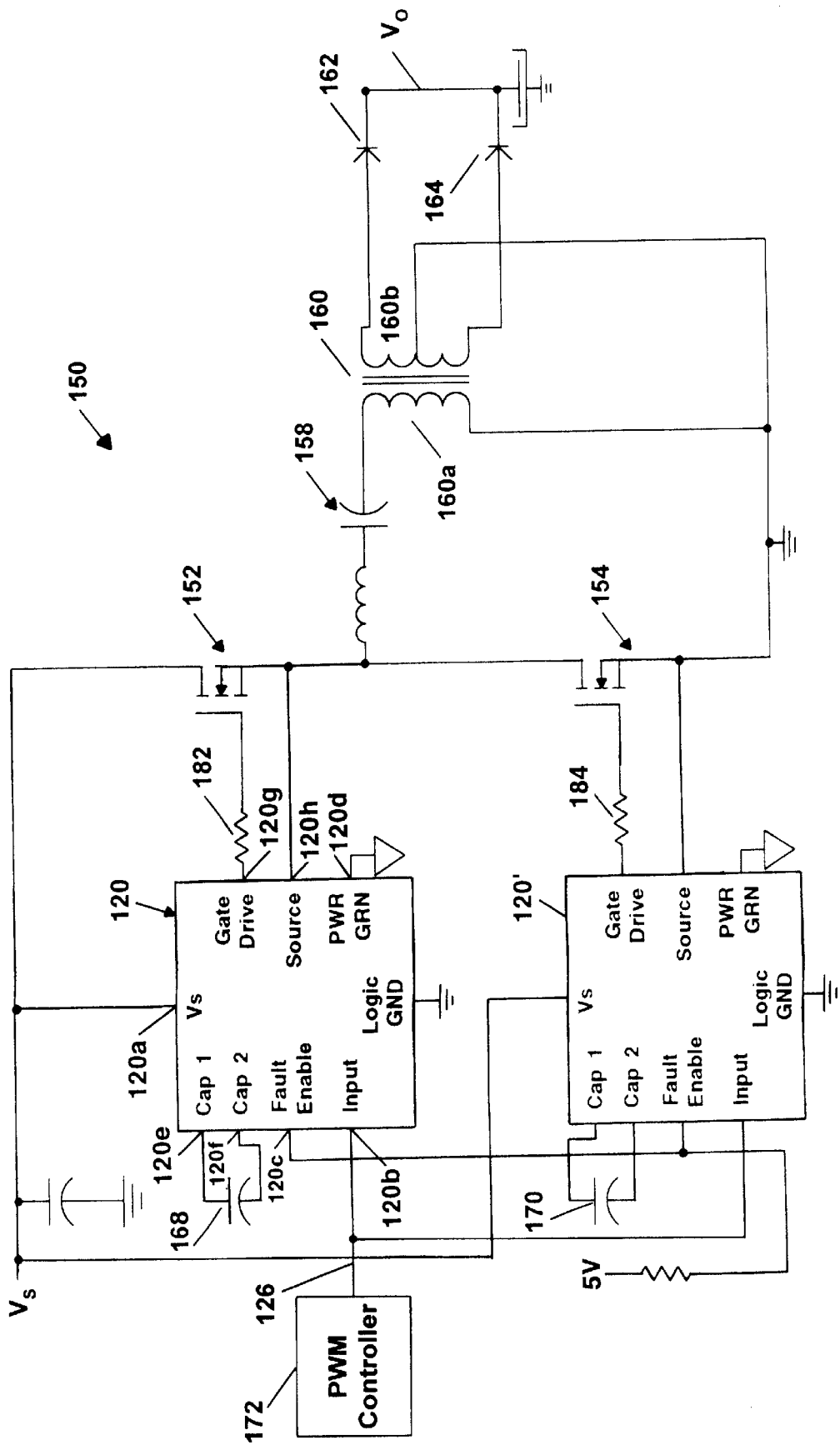
FIG. 4 is a schematic of an illustrative resonant converter utilizing four integrated circuits of the type shown in FIG. 3.
Figure 5D:
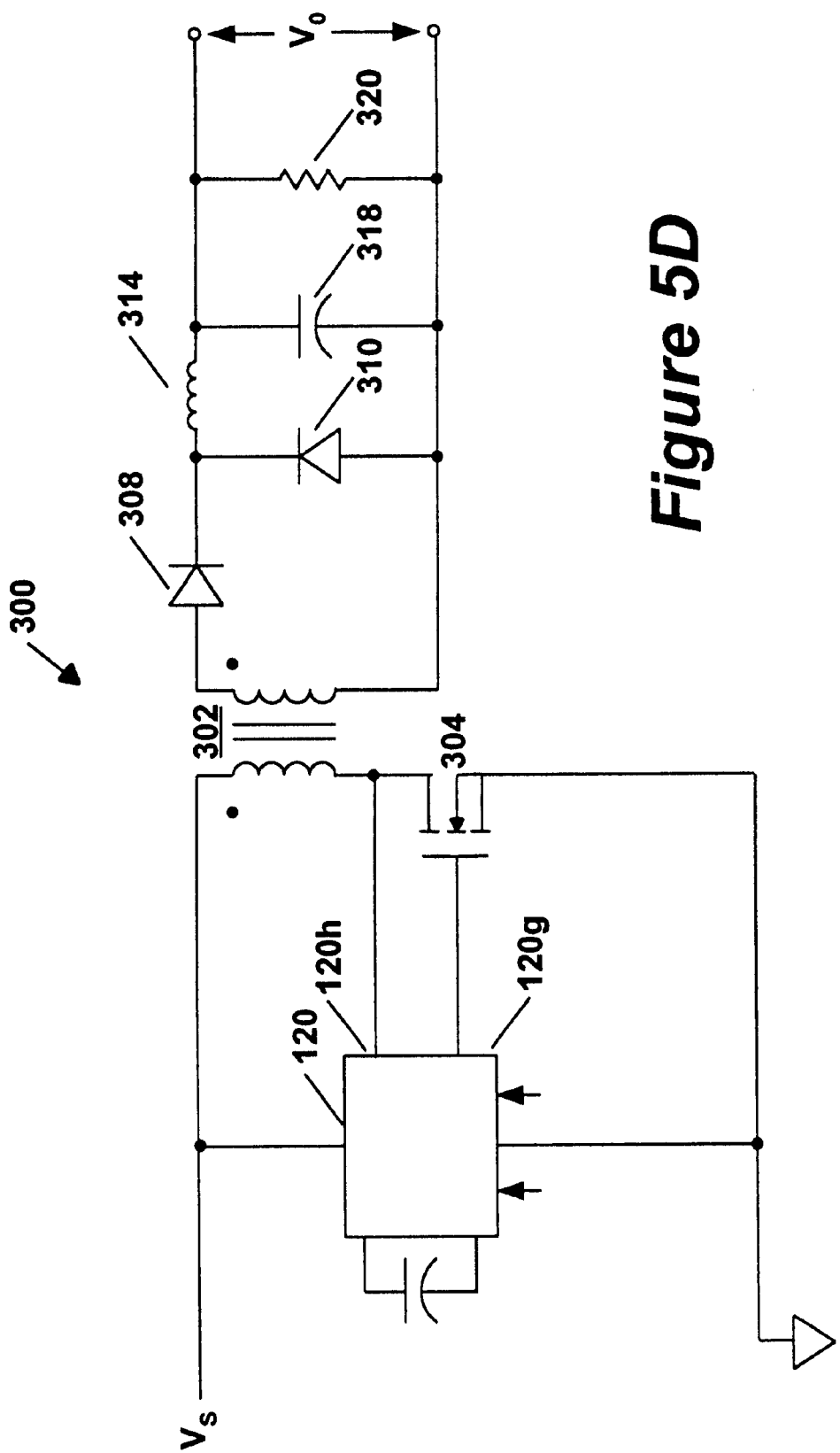
FIG. 5D is a schematic of a forward converter utilizing the circuit of FIG. 3.
Figure 5E:
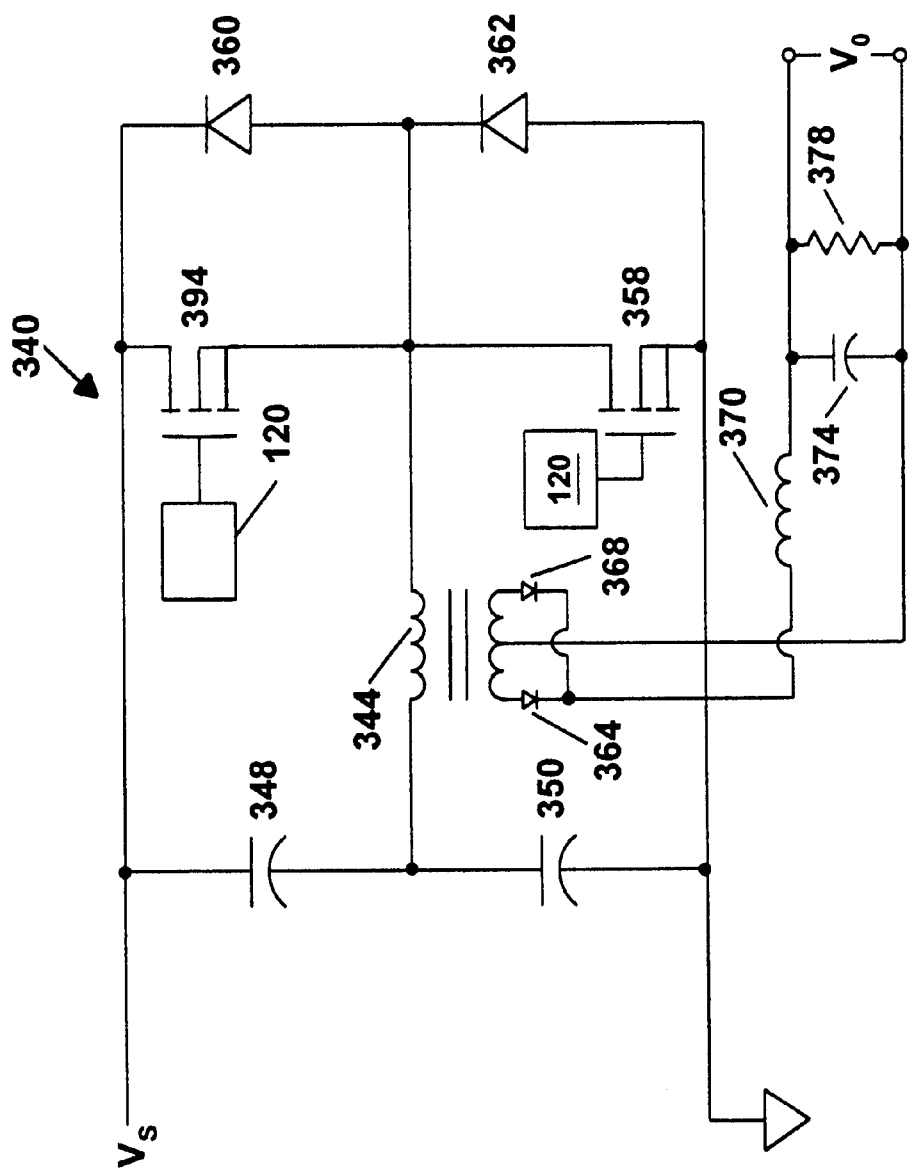
FIG. 5E is a schematic of a half-bridge converter utilizing the circuit of FIG. 3.

The control voltage circuit 20 of the present invention is suitable for driving switches arranged in various topologies, as will be described below in conjunction with FIGS. 4 and 5–5E. As examples, the control voltage circuit may be used to drive switches of a resonant converter as shown in FIG. 4, a Buck converter as shown in FIG. 5, a boost converter as shown in FIG. 5A, a Buck-boost converter as shown in FIG. 5B, a flyback converter as shown in FIG. 5C, or a forward converter as shown in FIG. 5D. Further, more than one control voltage circuit 20 may be used in a given application to drive respective switches, as in the case of the resonant converter of FIG. 4 and the half-bridge circuit of FIG. 5E. Thus, the control voltage circuit 20 can be considered "universal" in its suitability for driving switches arranged various topologies.

The controlled switch 14 may be a "high side" switch or a "low side" switch. A high side switch is one in which a terminal of the switch is coupled to the positive terminal of a voltage source. For example, switch 14 shown in FIG. 1 is a high side switch since its input terminal 14b is coupled to the positive terminal of the input voltage source 28. A low side switch is one in which a terminal of the switch is coupled to the negative terminal of a voltage source. For example, switch 286 of the flyback circuit 280 of FIG. 5C is a low side switch since its source terminal is coupled to the negative terminal of the input voltage source 28. When providing a control voltage to a high side switch, a predetermined voltage is required across the control and reference terminals; whereas, when providing a control voltage to a low side switch, a predetermined voltage is required across the input and control terminals.

In the illustrative embodiment of FIG. 1, the switch 14 is a power FET and, more particularly, is a N-type FET. Thus, the control terminal 14a of the switch is a gate terminal, the input terminal 14b is a drain terminal, the reference terminal 14c is a source terminal, and the gate terminal 14a must be brought to at least a predetermined voltage above the reference terminal 14c in order to turn on the switch. Alternatively however, the switch may be an P-type FET, in which case the gate terminal 14a must be brought to at least a predetermined voltage below the reference terminal 14c in order to turn on the switch. In applications in which the switch 14 is a FET, the control voltage circuit 20 may be referred to as a gate drive voltage circuit and the drive circuit 24 may be referred to as a gate drive circuit.

The control voltage source circuit 20 includes a capacitor 30, a first pair of switches 34, 36 adapted to couple the capacitor to the input voltage source 28 during a first time interval, and a second pair of switches 40, 42 adapted to couple the capacitor to the drive circuit 24 during a second time interval which is non-overlapping with respect to the first time interval. With this arrangement, the control voltage circuit 20 provides a voltage to the gate drive circuit 24 which is isolated from the input voltage source 28. Thus, current and voltage transients caused by the switching action of the switch 14 are prevented from affecting the input voltage source 28.

A control circuit 22 provides control signals to the switches 34, 36, 40, and 42 to open and close the switches, as will be discussed. In general, the first pair of switches 34, 36 is opened to de-couple the capacitor 30 from the input voltage source 28 when the voltage across the capacitor exceeds a predetermined level and the second pair of switches 40, 42 is opened to de-couple the capacitor from the drive circuit 24 when the voltage across the control and reference terminals 14a, 14c of the switch 14 falls below a second predetermined level. In this way, charge on the capacitor is replenished when the capacitor voltage falls below the second predetermined level in order to ensure full enhancement of the switch and the voltage applied to the switch is limited to the first predetermined level in order to prevent exceeding the Vgs rating of the switch.

Figure 2:
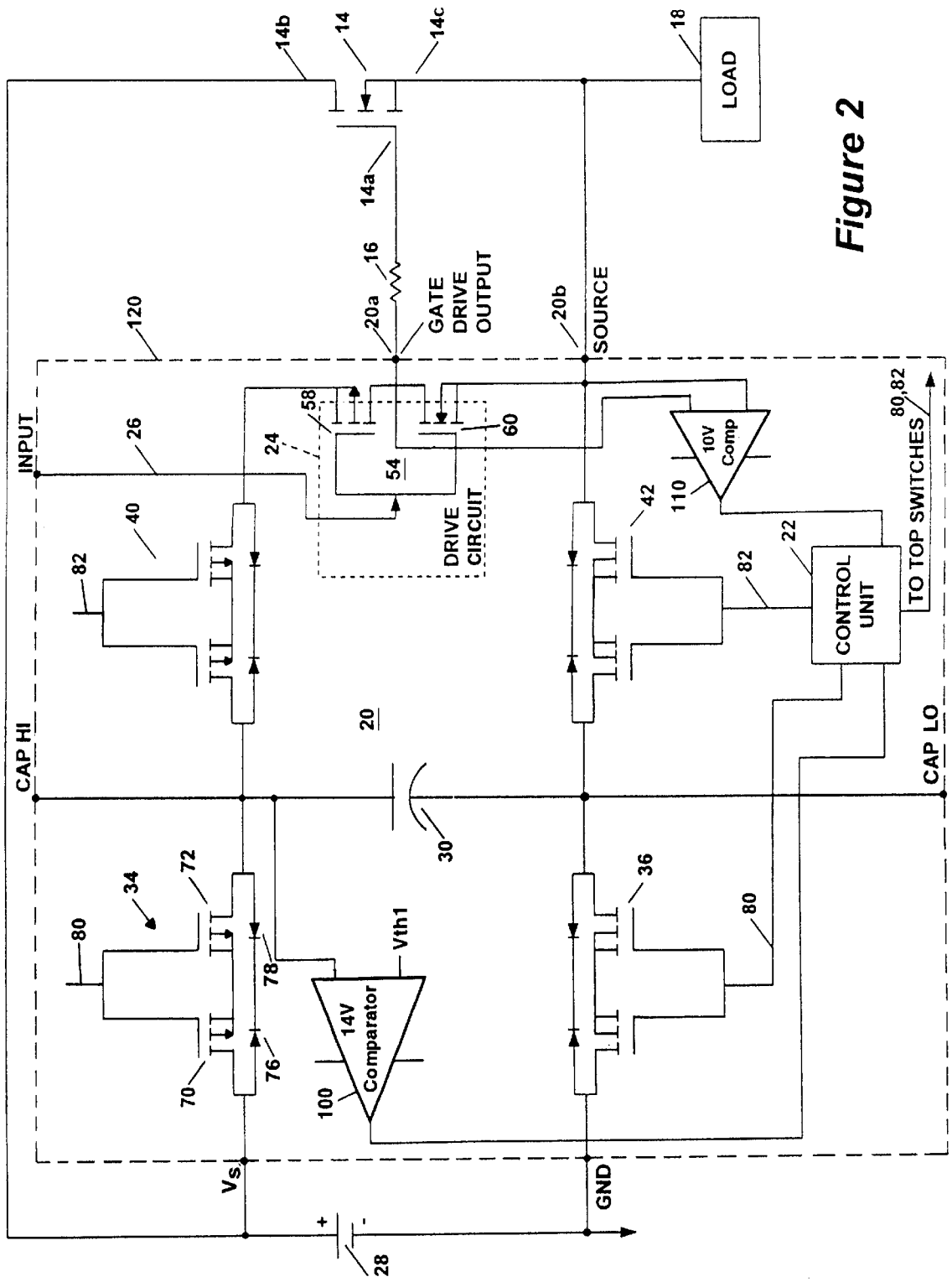
FIG. 2 is a more detailed block diagram of the circuit of FIG. 1.

Referring also to FIG. 2, a more detailed schematic of the circuit 10 of FIG. 1 is shown to include the switch 14, the input voltage source 28, the load 18, the drive circuit 24, and the control voltage source circuit 20. The drive circuit 24 includes an output driver 54 responsive to a control signal 26. The control signal 26 is provided by a controller 50 (not shown) which may take various forms, such as a conventional pulse-width modulation (PWM) controller. The control signal 26 is indicative of the output current or voltage of the load 18 and causes the duty cycle of the switch 14 to be adjusted so as to maintain the desired output current or voltage. The illustrative output driver 54 includes a pair of series-coupled FETs 58, 60 capable of providing the necessary source current to drive the gate terminal 14a of the FET 14, respectively, through a resistor 16. The resistor 16 is selected to control the slew rate of the FET 14.

Each of the switches 34, 36, 40, and 42 of the control voltage source circuit 20 may be implemented in various ways. In the illustrative embodiment, each such switch is comprised of a pair of series-coupled, commonly controlled FETs. Illustrative switch 34, for example, includes PMOS FET 70 coupled in series with PMOS FET 72. Each of the FETs 70, 72 has an intrinsic diode 76, 78, respectively, coupled as shown. The gate terminals of the FETs 70, 72 are responsive to a control signal 80 provided by the control circuit 22. Switches 36, 40, and 42 have like FETs 70, 72 with intrinsic diodes 76,78, as shown. Each of the switches 34, 36 is responsive to a control signal 80 and each of the switches 40, 42 is responsive to a control signal 82, as shown.

Alternatively, the switches 34 and 40 may be implemented with diodes and the switches 36, 42 with the illustrated series-coupled FETs. More particularly, switch 34 may be replaced by a diode having an anode coupled to the positive terminal of the input voltage source 28 and a cathode coupled to the positive terminal of the capacitor 30. Switch 40 may be replaced by a diode having an anode coupled to the positive terminal of the capacitor and a cathode coupled to the drive circuit 24.

The control circuit 22 is responsive to an output signal from a comparator 100 for providing the control signal 80 to switches 34 and 36 in order to open the switches 34, 36 and de-couple the capacitor 30 from the input voltage source 28 when the voltage across the capacitor exceeds a predetermined threshold level. The predetermined threshold level is set by the threshold voltage $V_{th1}$ applied to an input terminal of the comparator 100. Thus, the comparator 100 has a first input terminal coupled to the capacitor 30, a second input terminal responsive to the threshold voltage $V_{th1}$, and an output terminal at which an output signal is provided to the control circuit 22. The output signal of the comparator is indicative of whether the voltage across the capacitor 30 is greater or less than the threshold voltage. In the illustrative embodiment, the threshold voltage $V_{th1}$ is set to approximately 14 volts. With this arrangement, the capacitor 30 is prevented from charging to a voltage greater than approximately 14 volts. The threshold voltage is selected in order to protect the gate to source junction of the switch 14 by preventing application of a voltage of greater than the Vgs rating of the switch.

The control circuit 22 is further responsive to an output signal from a second comparator 110 for providing the control signal 82 to switches 40 and 42 in order to open the switches and de-couple the capacitor 30 from the gate and source terminals of the switch 14, via the drive circuit 24, when the voltage across the switch falls below a second predetermined threshold level $V_{th2}$. The comparator 110 has a first input terminal coupled to the gate terminal 14a of the switch 14, a second input terminal coupled to the source terminal 14c of the switch 14, and an output terminal at which an output signal is provided to the control circuit 22. The output signal of the comparator 110 is indicative of whether the voltage across the gate and source terminals of the switch is less than the second threshold voltage $V_{th2}$. The comparator 110 could be provided as a differential amplifier and comparator combination. In the illustrative embodiment, the threshold voltage $V_{th2}$ is set to approximately 10 volts. With this arrangement, the drive circuit 24 and thus the gate and source terminals of the switch 14 are supplied with a predetermined minimum voltage necessary to fully enhance the switch 14.

The switching frequency of the switch 14 is a function of the particular components and application. Switches 34, 36, 40 and 42 may be operated synchronously or asynchronously with respect to the switch 14.

As noted above, the control signal 80 coupled to the first pair of switches 34, 36 and the control signal 82 coupled to the second pair of switches 40, 42 are non-overlapping. With this arrangement, the input voltage source 28 is isolated from the switch 14, thereby preventing switching transients from affecting the input voltage source. Further, it is because of this isolation that the circuit 20 is able to supply the necessary control voltage to switches arranged in various topologies. That is, since the supplied voltage is not referenced to any particular potential, it can be used to provide a control voltage to a high side switch or to a floating low side switch.

There is a fixed time interval between opening the first pair of switches 34, 36 and closing the second pair of switches 40, 42. Likewise, there is a fixed time interval between opening the second pair of switches 40, 42 and closing the first pair of switches 34, 36. The manner in which the fixed dead times are selected as well as the relationship between the dead times and the charging and discharging rates of the capacitor depends upon the particular application. The flying capacitor value must be several times the gate capacity of the FET that flying capacitor drives. Ten times is a typical ratio, however other ratios may also be used.

Much of the control voltage circuit 20 may be incorporated into a monolithic integrated circuit. As one example, the components contained within the dotted line boundary 120 in FIG. 2 with the exception of the capacitor 30 may be provided on an integrated circuit, as will be described further in conjunction with FIG. 3. Of course, it will be appreciated by those of ordinary skill in the art that many variations to the integrated circuit 120 are possible, including which components are integrated and the connections that are provided at externally accessible pins.

Figure 3:
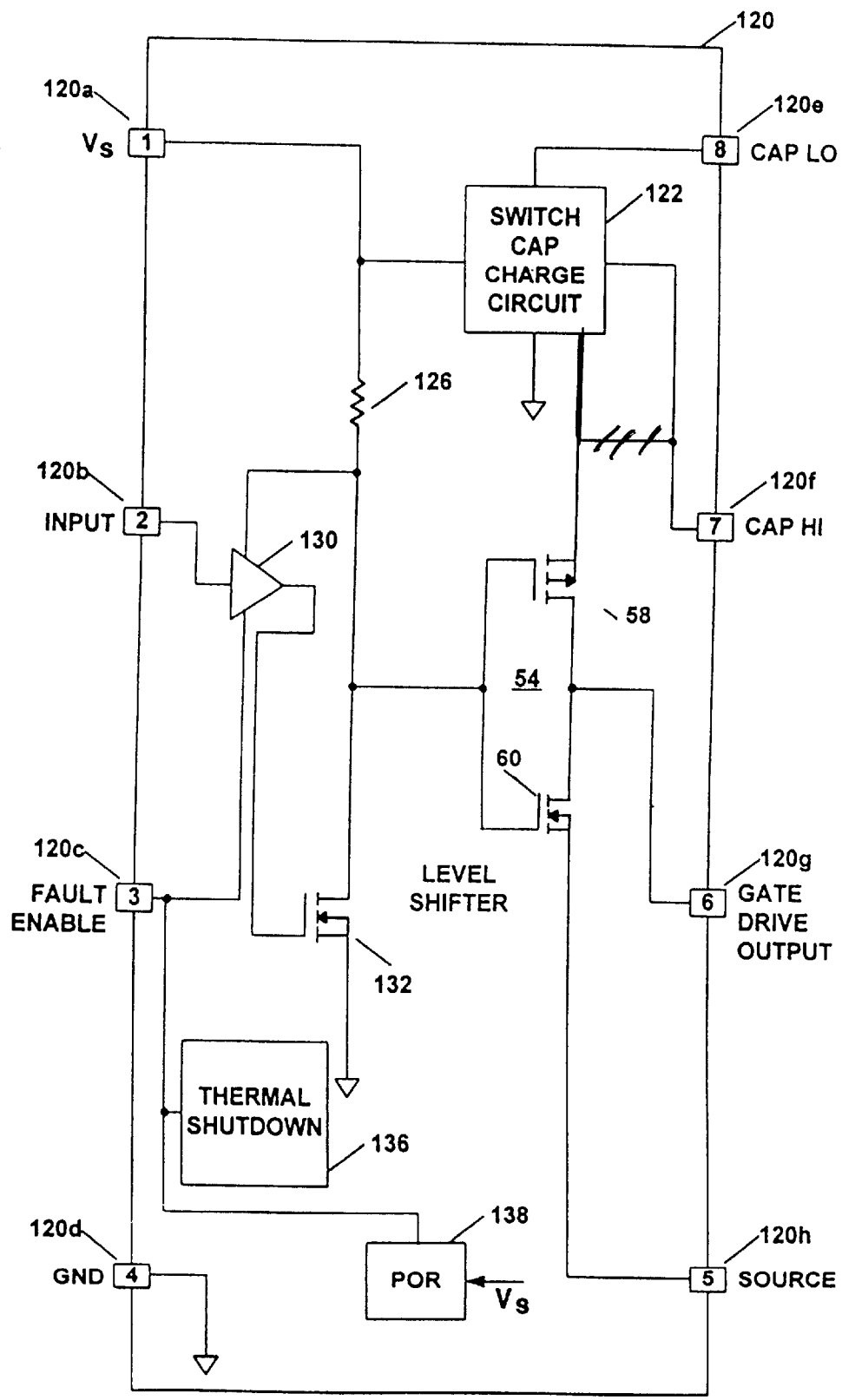
FIG. 3 is a block diagram of an illustrative integrated circuit incorporating the control voltage circuit of FIG. 2.

Referring also to FIG. 3, one embodiment of a portion of an integrated circuit 120 to be used in a complete switch control voltage circuit is shown. For example, it should be appreciated that neither the connection to the pin 120h associated with the driver circuit 54 (FIG. 2) nor the connection to the gate drive output pin 120g (FIG. 3A) is explicitly shown in FIG. 3. Given the description provided herein, however, one of ordinary skill in the art would understand how to make such connections.

Figure 3A:
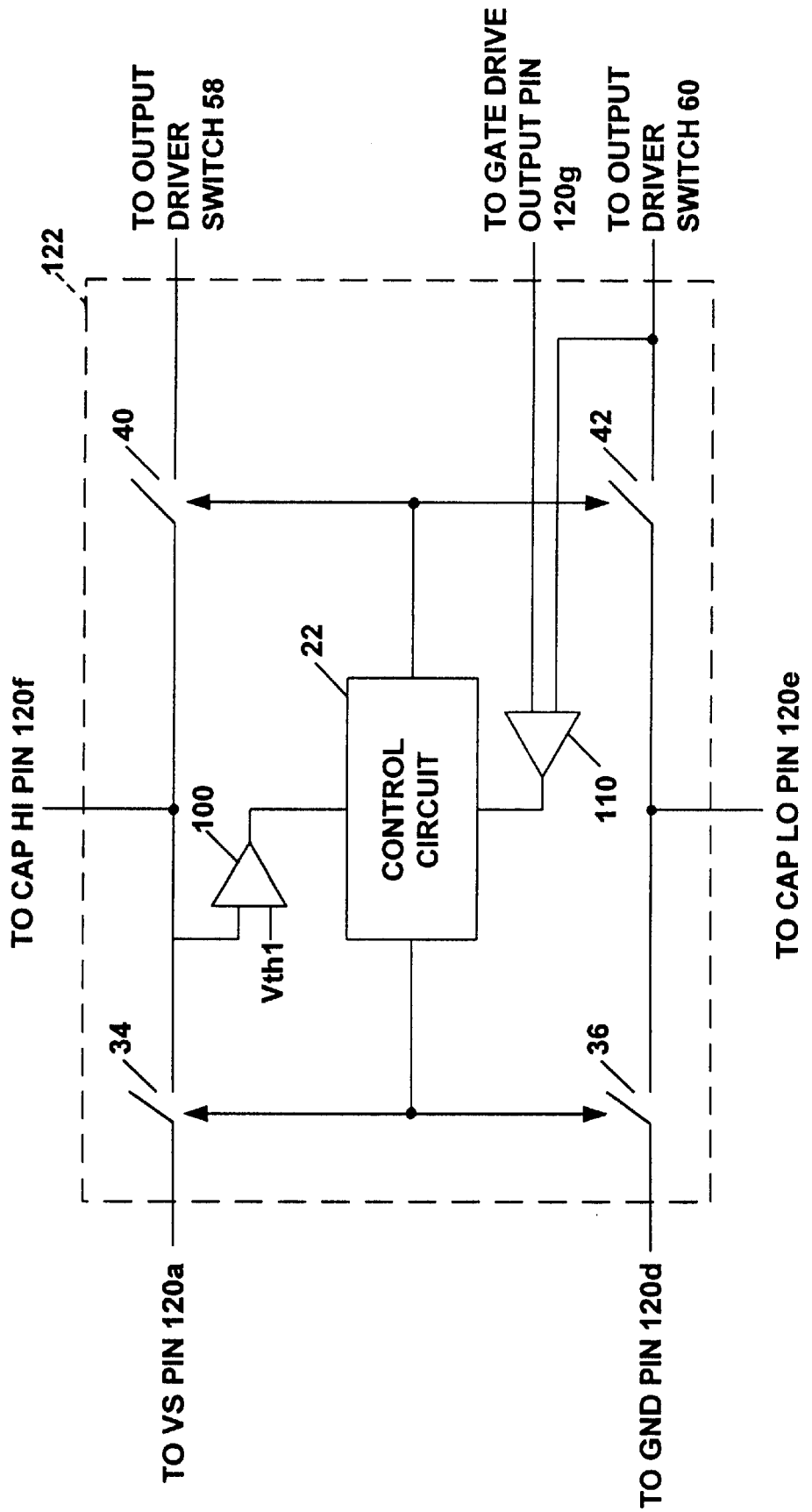
FIG. 3A is a schematic of the switch capacitor charge circuit of FIG. 3.

Integrated circuit 120 includes a $V_s$ pin 120a coupled to a switch capacitor charge circuit 122 which is shown in FIG. 3A to include the first pair of switches 34, 36, the second pair of switches 40, 42, the comparators 100, 110 and control circuit 22. The $V_s$ pin is further coupled to a resistor 126, as shown. External to the integrated circuit 120, the $V_s$ pin is adapted for coupling to the positive terminal of the input voltage source 28 (FIG. 2). The resistor 126 couples power to an internal buffer 130 and to the interconnected gate terminals of the output driver switches 58 and 60, as shown.

An INPUT pin 120b to the integrated circuit 120 is adapted for coupling to an external controller which produces a feedback, or control signal, such as a PWM signal 26 (FIG. 2). The PWM signal is internally coupled to the buffer 130 having an output coupled to a level shifting transistor 132, as shown. The buffer 130 can be disabled in response to a logic low fault signal coupled to a FAULT/ENABLE pin 120c. Various fault conditions may be monitored external to the integrated circuit 120 and used to provide the fault signal to the FAULT/ENABLE pin. Alternatively or additionally, fault conditions may be monitored on the chip 120, for example with a thermal shutdown circuit 136 and/or with a power on/reset (POR) circuit 138. The POR circuit holds the chip output off until power to the chip is within a predetermined range. In operation, either a power on/reset, over temperature, or other fault indicating condition disables the buffer 130 thereby disabling the GATE DRIVE OUTPUT pin 120g of the chip. This is achieved by pulling the output signal of the buffer 130 low to turn off the level shifting transistor 132 and the output driver 54. When no fault or disable conditions exist, the output of the buffer 130 controls the output driver 54 through transistor 132.

A CAP LO pin 120e of the chip is adapted for coupling to the positive terminal of the external capacitor 30 (FIG. 2) and a CAP HI pin 120f is adapted for coupling to the negative terminal of the capacitor 30. The voltage provided by the circuit 20 at terminals 20a and 20b (FIG. 1) is provided across the GATE DRIVE OUTPUT pin 120g and the SOURCE pin 120h of the chip 120.

Referring to FIG. 4, a resonant converter 150 is shown to include two integrated circuits 120 of the type shown in FIG. 3. The resonant converter 150 includes power transistors 152 and 154 coupled in series, with the interconnection between the power transistors coupled to the resonating capacitor 158 and transformer primary winding 160a, as shown. The transformer secondary 160b is coupled to synchronous rectifiers 162 and 164 having interconnected terminals at which the output voltage $V_o$ of the converter 150 is provided. Each of the resonant switches 152 and 154 is controlled by an integrated circuit 120 of the type shown in FIG. 3. The illustrative resonant converter 150 is a 500 Watt, DC-DC converter having an input voltage $V_s$ on the order of 42 volts and providing an output voltage $V_o$ on the order of 12 volts with a switching frequency on the order of 500 KHz.

More particularly, each of the power switches 152 and 154 is controlled by an integrated circuit 120, 120', respectively, which is responsive to an input voltage source $V_s$, as shown. An input signal 126 provided by a pulse width modulator controller 172 is coupled to an INPUT pin 120b of the integrated circuits 120 and 120', as shown. The gate drive signal provided at pin 120g of integrated circuits 120 and 120' is coupled to the gate terminal of the respective power switch 152 and 154 through resistors 182 and 184, respectively, as shown.

In the illustrative resonant converter 150, both integrated circuits 120, and 120' (referred to collectively as integrated circuits 120) have interconnected FAULT/ENABLE pins 120c. With this arrangement, a fault condition detected by any of the integrated circuits 120 causes all of the integrated circuits 120 and thus, the entire circuit 150, to shut down.

In operation, power switches 152 and 154 operate asynchronously to generate the output voltage $V_o$. More particularly, during a first half cycle, power switch 152 is closed causing charge to be transferred directly through the transformer 160 to the converter output $V_o$; whereas, during a second half cycle, the charge stored in the capacitor 158 and transformer winding 160a is transferred to the secondary 160b and also back through the primary 160a via conducting power switch 154.

As is apparent from consideration of the resonant converter 150 of FIG. 4, the control voltage circuit implemented by integrated circuits 120 is capable of generating an isolated control voltage for driving a high side switch 152, a low side switch 154, and output switches 162 and 164, as shown.

Referring also to FIG. 5, a Buck, or step-down converter 200 is shown to include a power transistor 202 and a load 204. The Buck converter 200 converts an input voltage $V_s$ to a lower output voltage $V_o$. The load 204 includes an inductor 206, a diode 208, a capacitor 210, and a resistor 212 across which the output voltage $V_o$ is provided.

An integrated circuit 120 of the type shown in FIG. 3 supplies the necessary gate drive signal to the power transistor 202. To this end, the circuit 120 has a $V_s$ pin 120a coupled to the positive terminal of the input voltage source $V_s$, a GND pin 120d coupled to the negative terminal of the input voltage source, a CAP HI pin 120f for coupling to the positive terminal of an external capacitor 220 and a CAP LO pin 120e for coupling to the negative terminal of the external capacitor 220, as shown. A FAULT/ENABLE pin 120c is provided for receiving an external fault/enable signal 124 and the INPUT pin 120b is responsive to a feedback signal 126, such as from a PWM controller (not shown). The gate drive signal is coupled to the gate terminal 202a and source terminal 202c of the switch 202 via a GATE DRIVE OUTPUT pin 120g and a SOURCE pin 120h, respectively, as shown.

In operation, when the transistor 202 conducts, energy is transferred directly from the input voltage source $V_s$ through the transistor 202 and inductor 206, to the output capacitor and resistor 220, 212, respectively. During non-conduction of the switch 202, current flows through the diode 208 and is thereby transferred from the inductor 206 to the output capacitor 210 and resistor 212. The conduction time intervals of the switch 202 are governed by the PWM control signal 126.

The transistor 202 is a high side transistor. Thus, the voltage at its source terminal 202c varies between the input voltage of $V_s$ to near ground. The circuit 120 provides a predetermined voltage differential between the gate terminal 202a and the source terminal 202c which is isolated from any known or reference potential, such as ground.

FIG. 5A shows the integrated circuit 120 used in a boost converter 230. The boost converter 230 includes a low side switch 232. In this application, the circuit 120 provides the gate drive signal via pin 120g to the gate terminal of low side switch 232 and the SOURCE pin 120h of circuit 120 is coupled to the drain terminal of the low side switch, as shown, since it is the drain terminal of the switch 232 which "floats."

In operation, when the switch 232 does not conduct, energy is transferred through the inductor 238 and diode 240 to the output capacitor 242. During intervals of conduction of the switch 232, the charge on the output capacitor 242 supplies the converter output voltage $V_o$.

FIG. 5B shows the circuit 120 in use in a Buck-boost converter 250 having a power switch 254 responsive to a gate drive signal provided at pin 120g of the circuit 120. The SOURCE pin 120h of circuit 120 is connected to the source terminal of the high-side NMOS switch 254. Thus, similar to the converter of FIG. 1, in the Buck-boost converter of FIG. 5B, the circuit 120 controls a high-side switch having a floating source terminal.

In operation, charge is transferred to the inductor 256 during intervals of conduction of the power switch 254 and is transferred from the inductor 256 to the output capacitor 260 during intervals of non-conduction of the primary switch 254.

Referring also to FIG. 5C, the integrated circuit 120 is in use in a flyback converter 280 in which the gate drive signal provided at pin 120h of the chip 120 is coupled to the gate terminal of power switch 286 and the SOURCE pin 120g of the circuit 120 is coupled to the drain terminal of the power switch 286, as shown, since it is the drain terminal of the power switch which "floats."

In operation, charge is transferred from the primary winding of the transformer 282 to the output capacitor 290 during intervals of conduction of the power switch 286 and is transferred from the storage capacitor 290 to the output $V_o$ during intervals of non-conduction of the primary switch.

Further examples of applications for the switch control voltage circuit of the present invention are shown in FIGS. 5D and 5E. In particular, FIG. 5D shows the circuit 120 in use in a forward converter 300 in which the primary switch 304 is an NMOS switch receiving a gate drive signal from pin 120g of the chip 120 and having the SOURCE pin 120h of the chip 120 coupled to the floating drain terminal of the power switch 304. FIG. 5E shows two integrated circuits 120 in use in a half-bridge converter. Each of the circuits 120 provides a gate drive signal to a respective switch 354, 358 in order to implement asynchronous operation of the switches.

It will be appreciated by those of ordinary skill in the art that the converter topologies shown in FIGS. 4 and 5–5E are illustrative only and that the switch control voltage circuit 20 of FIG. 1 alone, or in an integrated circuit implementation 120 (FIG. 3), may be used in a variety of circuit topologies beyond those shown herein.

Having described the preferred embodiments of the invention, it will now become apparent to one of ordinary skill in the art that other embodiments incorporating their concepts may be used.

It is felt therefore that these embodiments should not be limited to disclosed embodiments but rather should be limited only by the spirit and scope of the appended claims. All publications and references cited herein are expressly incorporated herein by reference in their entirety.

What is claimed is:

1. A circuit for generating a control voltage across a pair of output terminals for controlling a switch having an input terminal, a reference terminal, and a control terminal, said circuit comprising:
   a capacitor;
   a first pair of switches adapted to couple said capacitor to an input voltage source during a first time interval;
   a second pair of switches adapted to couple said capacitor to said pair of output terminals during a second time interval, non-overlapping with respect to said first time interval; and
   a control circuit providing a first control signal to said first pair of switches in response to the voltage across said capacitor and providing a second control signal to said second pair of switches.

2. The circuit of claim 1 wherein said switch is a transistor.

3. The circuit of claim 2 wherein said transistor is one of a FET and an IGBT.

4. The circuit of claim 1 wherein said second control signal is provided in response to the voltage across terminals of said switch.

5. A circuit for generating a control voltage across a pair of output terminals for controlling a switch having an input terminal, a reference terminal, and a control terminal, said circuit comprising:
   a capacitor;
   a first pair of switches adapted to couple said capacitor to an input voltage source during a first time interval;
   a second pair of switches adapted to couple said capacitor to said pair of output terminals during a second time interval, non-overlapping with respect to said first time interval;
   a control circuit providing a first control signal to said first pair of switches in response to the voltage across said capacitor and providing a second control signal to said second pair of switches, wherein said second control signal is provided in response to the voltage across terminals of said switch; and
   a first comparator having a first input terminal coupled to said capacitor, a second input terminal coupled to a threshold voltage, and an output terminal coupled to said control circuit at which an output signal is provided, wherein said output signal is indicative of whether or not the voltage across said capacitor is greater than a predetermined level and wherein said first control signal provided by said control circuit causes said first pair of switches to open when said voltage across said capacitor is greater than said predetermined level.

6. The circuit of claim 5 further comprising a second comparator having a first input terminal coupled to said control terminal of said switch, a second input terminal coupled to said reference terminal of said switch, and an output terminal coupled to said control circuit at which an output signal is provided, wherein said output signal is indicative of whether or not the voltage across said control and reference terminals of said switch is less than a second predetermined level and wherein said second control signal provided by said control circuit causes said second pair of switches to open when said voltage across said control and reference terminals of said switch is less than the second predetermined level.

7. The circuit of claim 1 wherein each of said first and second pairs of switches comprises either a diode and a FET or a pair of FETs.

8. A circuit responsive to an input voltage source and for providing the gate drive voltage to a gate drive circuit, said gate drive circuit adapted for biasing the gate terminal of a transistor further having a source terminal and a drain terminal, said circuit comprising:
   a capacitor having a first terminal and a second terminal;
   a first switch coupled between a first terminal of said input voltage source and a first terminal of said capacitor;
   a second switch coupled between a second terminal of said input voltage source and a second terminal of said capacitor, wherein said first and second switches are closed during a first time interval to charge said capacitor;
   a third switch coupled between said first terminal of said capacitor and said gate drive circuit;
   a fourth switch coupled between said second terminal of said capacitor and said gate drive circuit, wherein said third and fourth switches are closed during a second time interval to transfer charge from said capacitor to said gate drive circuit, and wherein said first and second time intervals do not overlap;
   a control circuit for providing a first control signal to said first switch and a second control signal to said second switch in response to the voltage across said capacitor and for providing a third control signal to said third switch and a fourth control signal to said fourth switch in response to the voltage across the gate and source terminals of said transistor; and
   a first comparator having a first input terminal coupled to said first terminal of said capacitor, a second input terminal coupled to a threshold voltage, and an output terminal coupled to said control circuit at which an output signal is provided, wherein said output signal is indicative of whether or not the voltage across said capacitor is greater than a predetermined level and wherein said first and second control signals provided by said control circuit cause said first and second switches to open when said voltage across said capacitor is greater than said predetermined level.

9. The circuit of claim 8 further comprising a second comparator having a first input terminal coupled to said gate terminal of said transistor, a second input terminal coupled to said source terminal of said transistor, and an output terminal coupled to said control circuit at which an output signal is provided, wherein said output signal is indicative of whether or not the voltage across said gate and source terminals of said transistor is less than a second predetermined level and wherein said third and fourth control signals provided by said control circuit cause said third and fourth switches to open when said voltage across said gate and source terminals of said transistor is less than the second predetermined level.

10. A circuit comprising:

a transistor having a gate terminal receiving a control signal from a gate drive circuit, a source terminal, and a drain terminal;

a load coupled to one of said source terminal and said drain terminal of said transistor, the other of said source terminal and said drain terminal coupled to an input voltage source; and a gate drive voltage circuit responsive to said input voltage source for providing a gate drive voltage to said gate drive circuit, said gate drive voltage circuit comprising:

a capacitor;

a first pair of switches adapted to couple said capacitor to said input to voltage source during a first time interval; and a second pair of switches adapted to couple said capacitor to said gate drive circuit during a second time interval, non-overlapping with respect to said first time interval.

11. The circuit of claim 10 wherein said load is one of a switch-mode power supply and a motor.

12. The circuit of claim 10 wherein said load has one of the following topologies: a Buck converter, a boost converter, a Buck-boost converter, a forward converter, a flyback converter, and a resonant converter.

13. The circuit of claim 10 wherein said transistor is a high-side switch having said drain terminal coupled to said input voltage source.

14. The circuit of claim 10 wherein said transistor is a low-side switch having said source terminal coupled to a predetermined reference voltage.

* * * * *

UNITED STATES PATENT AND TRADEMARK OFFICE
CERTIFICATE OF CORRECTION

PATENT NO. : 6,559,689 B1
DATED : May 6, 2003
INVENTOR(S) : Timothy A. Clark

It is certified that error appears in the above-identified patent and that said Letters Patent is hereby corrected as shown below:

<u>Column 2,</u>
Line 7, reads "adapted to coupled" should read -- adapted to couple --.

<u>Column 3,</u>
Line 48, reads "various topologies." should read -- in various topologies. --.

<u>Column 6,</u>
Line 10, reads "that flying" should read -- that the flying --.

Signed and Sealed this

Fifteenth Day of July, 2003

JAMES E. ROGAN
*Director of the United States Patent and Trademark Office*